United States Patent
Liu

(10) Patent No.: US 8,187,478 B2
(45) Date of Patent: May 29, 2012

(54) FABRICATING PROCESS OF STRUCTURE WITH EMBEDDED CIRCUIT

(75) Inventor: Yi-Chun Liu, Taipei County (TW)

(73) Assignee: Unimicron Technology Corp., Taoyuan (TW)

(*) Notice: Subject to any disclaimer, the term of this patent is extended or adjusted under 35 U.S.C. 154(b) by 912 days.

(21) Appl. No.: 12/211,637

(22) Filed: Sep. 16, 2008

(65) Prior Publication Data

US 2009/0301997 A1 Dec. 10, 2009

(30) Foreign Application Priority Data

Jun. 5, 2008 (TW) ................................ 97120997 A

(51) Int. Cl.
*H01B 13/00* (2006.01)
(52) U.S. Cl. ........................ 216/13; 216/17; 29/846
(58) Field of Classification Search ............ 216/13, 216/17, 18; 29/846
See application file for complete search history.

(56) References Cited

U.S. PATENT DOCUMENTS

| | | | |
|---|---|---|---|
| 4,617,253 A | 10/1986 | Taylor et al. | |
| 4,670,528 A | 6/1987 | Taylor et al. | |
| 5,795,919 A | 8/1998 | Mitumoto et al. | |
| 6,174,561 B1 | 1/2001 | Taylor | |
| 2004/0221448 A1* | 11/2004 | Naito et al. | 29/830 |
| 2005/0070090 A1 | 3/2005 | Lee et al. | |

FOREIGN PATENT DOCUMENTS

| | | |
|---|---|---|
| EP | 0164100 | 12/1985 |
| JP | 10-326559 | 12/1998 |
| JP | 2002-232121 | 8/2002 |
| JP | 2002-232122 | 8/2002 |
| JP | 2002-232136 | 8/2002 |
| JP | 2006-036933 | 2/2006 |
| TW | 441002 | 6/2001 |

OTHER PUBLICATIONS

"Office Action of Taiwan Counterpart Application", issued on Apr. 6, 2012, p1-p6, in which the listed reference was cited.

* cited by examiner

*Primary Examiner* — Roberts Culbert
(74) *Attorney, Agent, or Firm* — J.C. Patents

(57) ABSTRACT

A fabricating process of a structure with an embedded circuit is described as follows. Firstly, a substrate having an upper surface and a lower surface opposite to the upper surface is provided. Afterward, a dielectric layer is formed on the upper surface of the substrate. Next, a plating-resistant layer is formed on the dielectric layer. Then, the plating-resistant layer and the dielectric layer are patterned for forming an recess pattern on the dielectric layer. Subsequently, a conductive base layer is formed in the recess pattern by using a chemical method, and the plating-resistant layer is exposed by the conductive base layer. After that, the plating-resistant layer is removed.

30 Claims, 9 Drawing Sheets

FABRICATING PROCESS OF STRUCTURE WITH EMBEDDED CIRCUIT

CROSS-REFERENCE TO RELATED APPLICATION

This application claims the priority benefit of Taiwan application serial no. 97120997, filed on Jun. 5, 2008. The entirety of the above-mentioned patent application is hereby incorporated by reference herein and made a part of specification.

BACKGROUND OF THE INVENTION

1. Field of the Invention

The present invention relates to a fabricating process of a circuit structure, and particularly relates to a fabricating process of a structure with an embedded circuit.

2. Description of Related Art

At present, the technology of embedded circuit board has been developed, which features that a circuit structure on the surface of a circuit board is embedded in a dielectric layer rather than protruded on the surface of the dielectric layer. FIGS. 1A through 1C illustrate a process flow for fabricating a conventional embedded circuit board.

First, referring to FIG. 1A, a substrate 110 is provided. A patterned dielectric layer 120 having a recess pattern 122 is formed on the substrate 110. The recess pattern 122 has a through hole 122a and a trench 122b. Next, referring to FIG. 1B, a seed layer (not shown) is formed on the patterned dielectric layer 120. Then, a copper layer 130 is formed by an electroless plating process and an electroplating process to fill the recess pattern 122. Thereafter, referring to FIG. 1C, the copper layer 130 is etched to form a conductive via 130a and a circuit 130b.

According to the conventional technique, the copper layer 130 is required to fill the through hole 122a which is deeper and the trench 122b which is shallow, and the surface of the copper layer 130 needs to be substantially even. Hence, the copper layer 130 has larger thickness (about 20 micrometers). As a consequence, it takes more time to etch the copper layer 130, and the conductive via 130a and the circuit 130b, especially fine circuit, are easily damaged during the etching process.

SUMMARY OF THE INVENTION

The present invention provides a fabricating process of a structure with an embedded circuit, which is adapted for forming a fine circuit structure.

To specify the content of the present invention, a fabricating process of a structure with an embedded circuit is described as follows. First, a substrate having an upper surface and a lower surface opposite to the upper surface is provided. Next, a first dielectric layer is formed on the upper surface of the substrate. Then, a first plating-resistant layer is formed on the first dielectric layer. Thereafter, the first plating-resistant layer and the first dielectric layer are patterned, so as to form a first recess pattern on the first dielectric layer. Following that, a first conductive base layer is formed in the first recess pattern by using a chemical method, and the first plating-resistant layer is exposed by the first conductive base layer. Then, the first plating-resistant layer is removed.

In an embodiment of the present invention, a material of the first plating-resistant layer comprises a hydrophobic polymer material.

In an embodiment of the present invention, the hydrophobic polymer material comprises carbon and hydrogen.

In an embodiment of the present invention, the hydrophobic polymer material comprises methacrylate resin, vinyl phenyl resin, allyl resin, polyacrylate resin, polyether resin, polyolefin resin, polyamine resin, or polysiloxane resin.

In an embodiment of the present invention, a method for forming the first plating-resistant layer comprises Liquid Phase Deposition (LPD) or molecular vapor deposition (MVD).

In an embodiment of the present invention, a method for removing the first plating-resistant layer comprises dry etching, a reverse process of molecular vapor deposition, polishing, scraping or other simple machining. The dry etching comprises plasma etching.

In an embodiment of the present invention, a method for removing the first plating-resistant layer comprises transforming the first plating-resistant layer into a first hydrophilic film and immersing the first hydrophilic film in an etching solution.

In an embodiment of the present invention, a method for patterning the first plating-resistant layer and the first dielectric layer comprises laser ablating, plasma etching, or mechanical cutting.

In an embodiment of the present invention, the mechanical cutting process comprises water-jet cutting, sandblasting, or routing.

In an embodiment of the present invention, the chemical method comprises chemical metal deposition or chemical vapor deposition.

In an embodiment of the present invention, after forming the first conductive base layer, a fabricating process of a structure with an embedded circuit further comprises forming a first thick conductive layer on the first conductive base layer by electroless plating, and a thickness of the first thick conductive layer is larger than that of the first conductive base layer.

In an embodiment of the present invention, a fabricating process of a structure with an embedded circuit further comprises the following processes. First, a second dielectric layer is formed on the lower surface of the substrate. Next, a second plating-resistant layer is formed on the second dielectric layer. Then, the second plating-resistant layer and the second dielectric layer are patterned, so as to form a second recess pattern on the second dielectric layer. Following that, a second conductive base layer is formed in the second recess pattern by using a chemical method, and the second plating-resistant layer is exposed by the second conductive base layer. Thereafter, the second plating-resistant layer is removed.

In an embodiment of the present invention, after forming the second conductive base layer, a fabricating process of a structure with an embedded circuit further comprises forming a second thick conductive layer on the second conductive base layer by electroless plating, and a thickness of the second thick conductive layer is larger than that of the second conductive base layer.

In an embodiment of the present invention, before forming the first plating-resistant layer, a fabricating process of a structure with an embedded circuit further comprises forming a first initial conductive layer on the first dielectric layer, and a method for forming the first initial conductive layer comprises chemical metal deposition. The first dielectric layer comprises a plurality of catalyst particles. When the first recess pattern is formed on the first dielectric layer, a fabricating process of a structure with an embedded circuit further comprises activating and exposing a portion of the catalyst particles, and the chemical method comprises electroless plating. The catalyst particles are a plurality of nanoparticles, which comprise transition metal complex. A material of the transition metal complex is selected from a group of manganese, chromium, palladium, and platinum.

In addition, after forming the first conductive base layer, a fabricating process of a structure with an embedded circuit further comprises forming a first thick conductive layer on the first conductive base layer by electroplating. After removing the first plating-resistant layer, a fabricating process of a structure with an embedded circuit further comprises removing the first initial conductive layer and a portion of the first thick conductive layer protruding outside the first dielectric layer. A method for removing the first initial conductive layer and the portion of the first thick conductive layer comprises etching or polishing.

Moreover, a fabricating process of a structure with an embedded circuit further comprises the following processes. First, a second dielectric layer is formed on the lower surface of the substrate. Next, a second initial conductive layer is formed on the second dielectric layer. Then, a second plating-resistant layer is formed on the second dielectric layer. Thereafter, the second plating-resistant layer and the second dielectric layer are patterned, so as to form a second recess pattern on the second dielectric layer. Following that, a second conductive base layer is formed in the second recess pattern by a chemical method. Next, a second thick conductive layer is formed on the second conductive base layer by electroplating. Thereafter, the second plating-resistant layer is removed. Then, the second initial conductive layer and a portion of the second thick conductive layer protruding outside the second dielectric layer are removed.

To specify the content of the present invention, a fabricating process of a structure with an embedded circuit comprising the following processes is described as follows. First, a substrate having an upper surface and a lower surface opposite to the upper surface is provided. Then, a first dielectric layer, which comprises a plurality of first catalyst particles, is formed on the upper surface of the substrate. Next, a first hydrophilic film is formed on the first dielectric layer. Thereafter, the first hydrophilic film and the first dielectric layer are patterned, so as to form a first recess pattern on the first dielectric layer, and to activate and expose a portion of the first catalyst particles in the first recess pattern. Following that, the first hydrophilic film is removed. Next, a first patterned conductive layer is formed in the first recess pattern by using a chemical method.

In an embodiment of the present invention, a material of the first hydrophilic film comprises a hydrophilic polymer material.

In an embodiment of the present invention, a material of the hydrophilic polymer material comprises carbon and hydrogen.

In an embodiment of the present invention, the hydrophilic polymer material comprises polyvinyl alcohol, polyoxyethylene, or poly(acrylic acid) bonded with a hydrophilic functional group, wherein the hydrophilic functional group is OH, $CONH_2$, $SO_3$, or COOH.

In an embodiment of the present invention, a method for forming the first hydrophilic film comprises Liquid Phase Deposition (LPD) or molecular vapor deposition (MVD).

In an embodiment of the present invention, a method for removing the first hydrophilic film comprises water washing.

In an embodiment of the present invention, the first catalyst particles are a plurality of nanoparticles.

In an embodiment of the present invention, a material of the first catalyst particles comprise transition metal complex.

In an embodiment of the present invention, a material of the transition metal complex is selected from a group of manganese, chromium, palladium, and platinum.

In an embodiment of the present invention, a method for patterning the first hydrophilic film and the first dielectric layer comprises laser ablating, plasma etching, or mechanical cutting.

In an embodiment of the present invention, the mechanical cutting process comprises water-jet cutting, sandblasting, or routing.

In an embodiment of the present invention, the chemical method comprises electroless plating or chemical vapor deposition.

In an embodiment of the present invention, after the first hydrophilic film and the first dielectric layer are patterned, a fabricating process of a structure with an embedded circuit further comprises performing a desmear treatment on the first recess pattern.

In an embodiment of the present invention, the desmear treatment comprises a chemical oxidation reduction or a plasma treatment.

In an embodiment of the present invention, after removing the first hydrophilic film, a fabricating process of a structure with an embedded circuit further comprises passivating an upper edge of a sidewall of the first recess pattern on the first dielectric layer.

In an embodiment of the present invention, before forming the first patterned conductive layer, a fabricating process of a structure with an embedded circuit further comprises disposing a first conductive material in the first recess pattern.

In an embodiment of the present invention, the first conductive material comprises copper paste, copper glue, carbon glue, carbon paste, silver paste, or silver glue.

In an embodiment of the present invention, a fabricating process of a structure with an embedded circuit further comprises the following processes. First, a second dielectric layer, which comprises a plurality of second catalyst particles, is formed on the lower surface of the substrate. Next, a second hydrophilic film is formed on the second dielectric layer. Then, the second hydrophilic film and the second dielectric layer are patterned, so as to form a second recess pattern on the second dielectric layer, and to activate and expose a portion of the second catalyst particles in the second recess pattern. Following that, the second hydrophilic film is removed. Thereafter, a second patterned conductive layer is formed in the second recess pattern by using a chemical method.

In an embodiment of the present invention, before forming the second patterned conductive layer, a fabricating process of a structure with an embedded circuit further comprises disposing a second conductive material in the second recess pattern.

In an embodiment of the present invention, the second conductive material comprises copper paste, copper glue, carbon glue, carbon paste, silver paste, or silver glue.

In view of the above, the dielectric layer in the present invention is covered by the plating-resistant layer. Consequently, in this embodiment, the conductive base layer may be selectively formed on a certain area of the dielectric layer by using the chemical method. Hence, a conventional etching process for removing the additional conductive layer is not required in this embodiment, and thereby the problem of damaging the conductive via and the circuit can be avoided during the etching process. It is known from the above that the present invention is adapted for the fabrication of a fine circuit.

In addition, unlike a conventional technique in which a seed layer needs to be formed on the dielectric layer before performing an electroless plating process, the chemical method in the present invention can be applied in directly forming the conductive base layer on the dielectric layer. Hence, the fabricating process in the present invention is simplified.

To make the above and other objectives, features, and advantages of the present invention more comprehensible, preferable embodiments accompanied with figures are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

FIGS. 2A through 2E and FIGS. 3A through 3D are schematic cross-sectional views illustrating a fabricating process of a structure with an embedded circuit according to the first embodiment of the present invention.

Figure 2A:
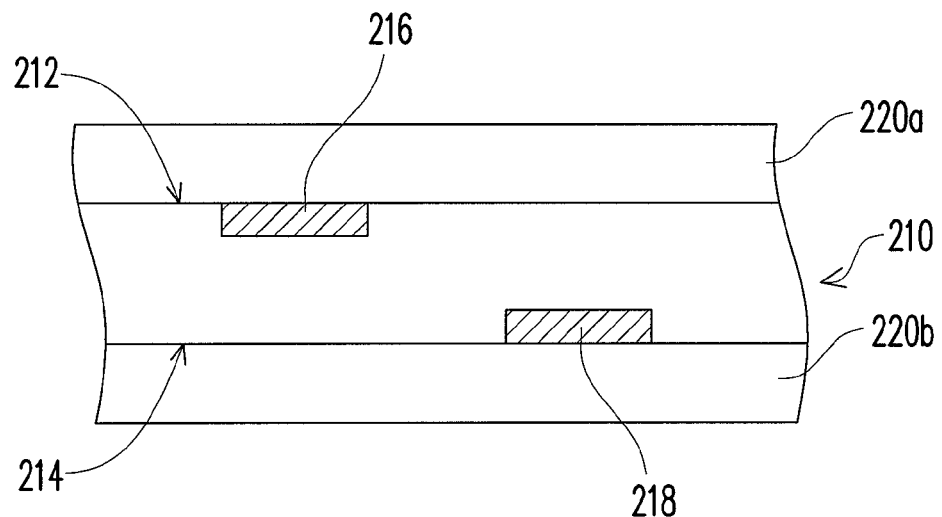
FIGS. 2A through 2E and FIGS. 3A through 3D are schematic cross-sectional views illustrating a fabricating process of a structure with an embedded circuit according to the first embodiment of the present invention.

First, referring to FIG. 2A, a substrate 210 is provided. The substrate 210 may be a dielectric substrate, a single-layer circuit substrate, or a multi-layer circuit substrate. The substrate 210 taken as an example in this embodiment is a double-layer circuit board. However, the present invention is not limited thereto. The substrate 210 comprises an upper surface 212 and a lower surface 214 opposite to the upper surface 212. According to the figures of this embodiment, the substrate 210 may comprise two bonding pads 216 and 218 respectively disposed on the upper surface 212 and the lower surface 214. Next, a first dielectric layer 220a is formed on the upper surface 212 of the substrate 210, and a second dielectric layer 220b is formed on the lower surface 214 of the substrate 210. The first dielectric layer 220a and the second dielectric layer 220b may be formed by polyimide, polydimethylsiloxane, or ABF film.

Figure 2B:
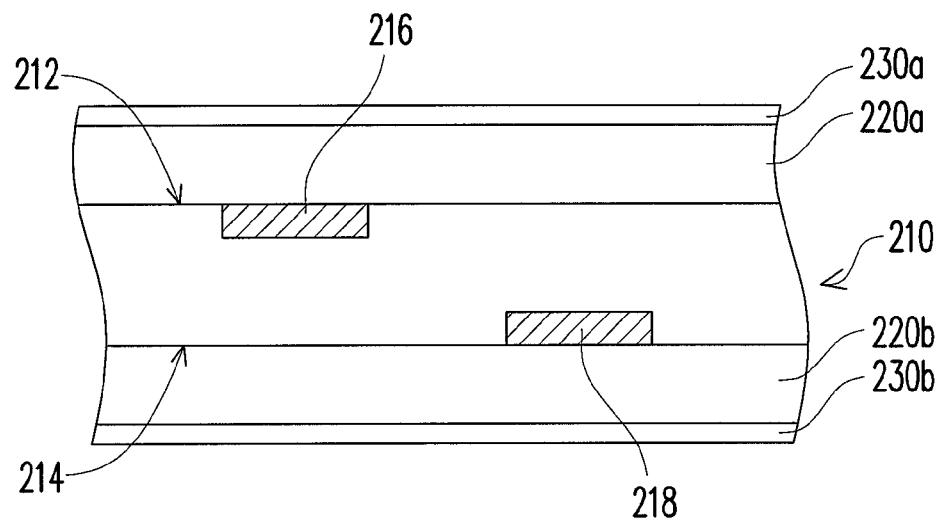

Then, referring to FIG. 2B, a first plating-resistant layer 230a is formed on the first dielectric layer 220a, and a second plating-resistant layer 230b is formed on the second dielectric layer 220b. In addition, the first plating-resistant layer 230a and the second plating-resistant layer 230b are, for example, formed by a hydrophobic polymer material or other suitable liquid hydrophobic materials, and the hydrophobic polymer material comprises carbon and hydrogen. The hydrophobic polymer material further comprises methacrylate resin, vinyl phenyl resin, allyl resin, polyacrylate resin, polyether resin, polyolefin resin, polyamine resin, polysiloxane resin, or other suitable liquid hydrophobic materials. The hydrophobic polymer material has favorable hydrophobicity. In other words, water or water solution are not easily cohered to a surface of the hydrophobic polymer material. A method for forming the first plating-resistant layer 230a and the second plating-resistant layer 230b (for example, the hydrophobic polymer material) comprises Liquid Phase Deposition (LPD) or molecular vapor deposition (MVD).

Figure 2C:
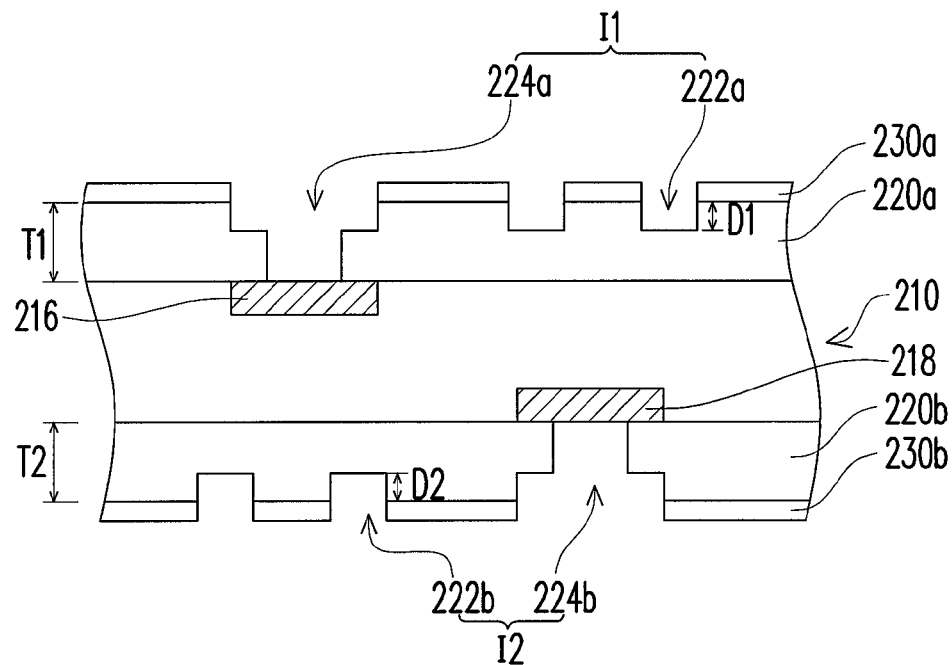

Thereafter, referring to FIG. 2C, the first plating-resistant layer 230a, the first dielectric layer 220a, the second plating-resistant layer 230b, and the second dielectric layer 220b are patterned, so as to respectively form a first recess pattern I1 and a second recess pattern I2 on the first dielectric layer 220a and the second dielectric layer 220b. A method for patterning the first plating-resistant layer 230a, the first dielectric layer 220a, the second plating-resistant layer 230b, and the second dielectric layer 220b is, for example, laser ablating, plasma etching, or mechanical cutting, wherein the mechanical cutting process comprises water-jet cutting, sandblasting, or routing.

The first recess pattern I1 may comprise at least a first trench 222a and at least a first through hole 224a, and the second recess pattern I2 may comprise at least a second trench 222b and at least a second through hole 224b. The first through hole 224a and the second through hole 224b respectively expose two bonding pads 216 and 218. A cross-sectional view of the first through hole 224a and the second through hole 224b is, for example, T-shaped (as shown in FIG. 2C), trapezoid (not shown), or taper. A depth D1 of the first trench 222a and a depth D2 of the second trench 222b are respectively smaller than a thickness T1 of the first dielectric layer 220a and a thickness T2 of the second dielectric layer 220b.

Figure 2D:
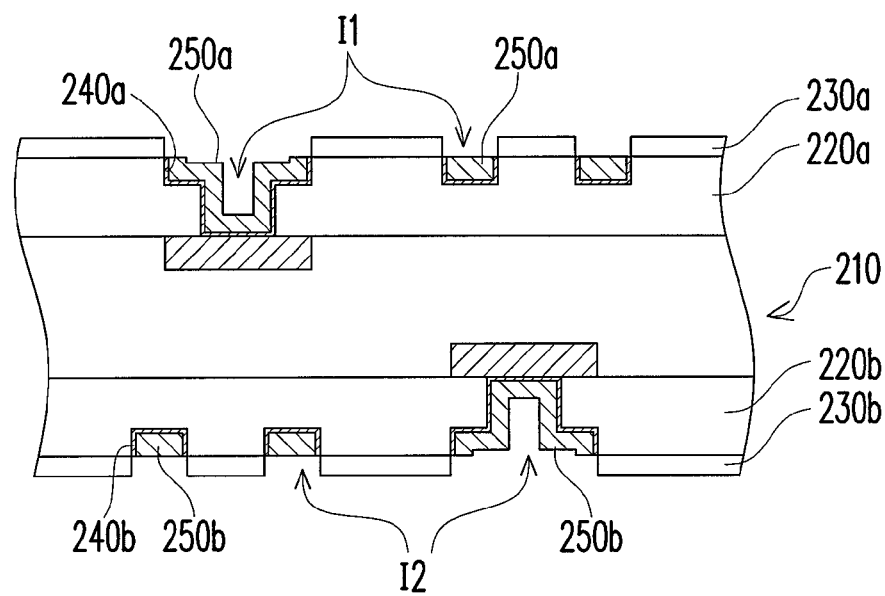

Next, referring to FIG. 2D, a first conductive base layer 240a and a second conductive base layer 240b are respectively formed in the first recess pattern I1 and the second recess pattern I2 by a chemical method. Further, the first conductive base layer 240a and the second conductive base layer 240b respectively expose the first plating-resistant layer 230a and the second plating-resistant layer 230b. In this embodiment, the chemical method comprises chemical metal deposition or chemical vapor deposition, wherein the chemical metal deposition is, for example, chemical copper deposition. Moreover, in this embodiment, before forming the first conductive base layer 240a and the second conductive base layer 240b, a surface treatment (for example, a surface roughening process) may be performed on the first dielectric layer 220a and the second dielectric layer 220b to increase the adhesion of the first conductive base layer 240a and the second conductive base layer 240b. It is noted that, different from conventional technology, the first dielectric layer 220a in this embodiment is covered by the first plating-resistant layer 230a. Hence, when the first conductive base layer 240a is formed by the chemical method, the first conductive base layer 240a is formed only on a part of the first dielectric layer 220a exposed by the first plating-resistant layer 230a (i.e. the first recess pattern I2), not on the first plating-resistant layer 230a. Similarly, the second conductive base layer 240b is formed only on the second recess pattern I2, not on the second plating-resistant layer 230b.

Figure 1A:
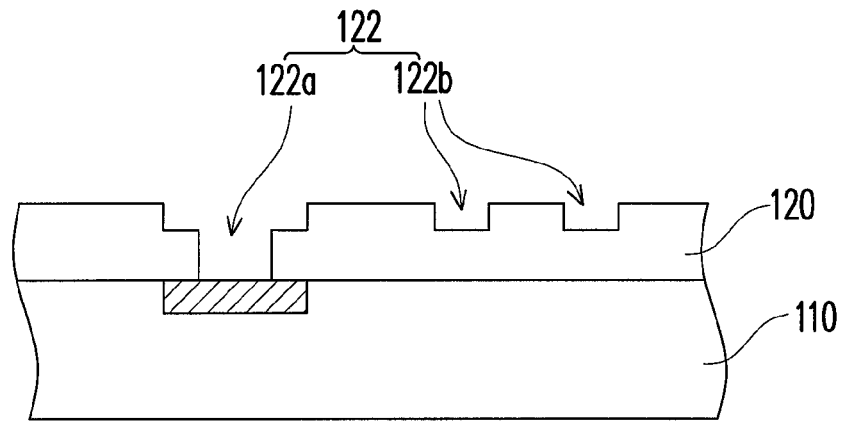
FIGS. 1A through 1C illustrate a process flow for fabricating a conventional embedded circuit board.

It is known from the above that, in this embodiment, the first conductive base layer 240a and the second conductive base layer 240b are selectively formed on certain areas (for example, the first recess pattern I1 and the second recess pattern I2) of the first dielectric layer 220a and the second dielectric layer 220b by using the chemical method. Hence, a conventional etching process for removing additional conductive layer is not required in this embodiment, and therefore the problem of damaging the conductive via 130a and the circuit 130b can be avoided during the etching process (referring to FIGS. 1A through 1C). For this reason, this embodiment is adapted for the fabrication of a fine circuit.

Thereafter, referring to FIG. 2D, after forming the first conductive base layer 240a and the second conductive base layer 240b, a first thick conductive layer 250a and a second thick conductive layer 250b are respectively formed on the first conductive base layer 240a and the second conductive base layer 240b by electroless plating. A thickness of the first thick conductive layer 250a is larger than that of the first conductive base layer 240a. A thickness of the second thick conductive layer 250b is larger than that of the second conductive base layer 240b.

Figure 2E:
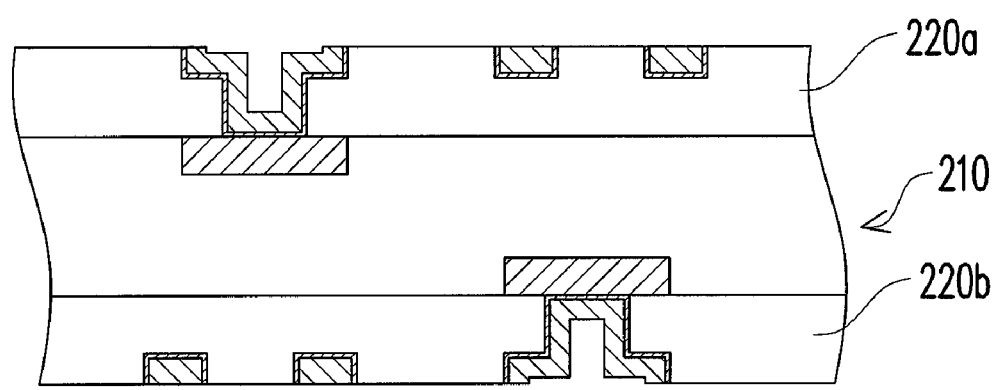

Then, referring to FIG. 2E, the first plating-resistant layer 230a and the second plating-resistant layer 230b are removed. A method for removing the first plating-resistant layer 230a and the second plating-resistant layer 230b comprises dry etching, a reverse process of molecular vapor deposition, polishing, scraping, or other simple mechanical processes. Herein, the dry etching process comprises plasma etching.

Besides, in this embodiment, a method for removing the first plating-resistant layer 230a and the second plating-resistant layer 230b includes transforming the first plating-resistant layer 230a and the second plating-resistant layer 230b into a first hydrophilic film and a second hydrophilic film respectively. The method for transforming the first plating-resistant layer 230a and the second plating-resistant layer 230b into a first hydrophilic film and a second hydrophilic film is, for example, a reverse process of molecular vapor deposition.

The first plating-resistant layer 230a and the second plating-resistant layer 230b are originally hydrophobic and not easily be wetted, and the first plating-resistant layer 230a and the second plating-resistant layer 230b are transformed into the wettable first hydrophilic film and the wettable second hydrophilic film by the reverse process of molecular vapor deposition. About the reverse process of molecular vapor deposition, the technical literature disclosed to the public, for example pp. 288-290 of Micro Total Analysis Systems 2004 published by Royal Society of Chemistry, is referred.

Figure 3A:
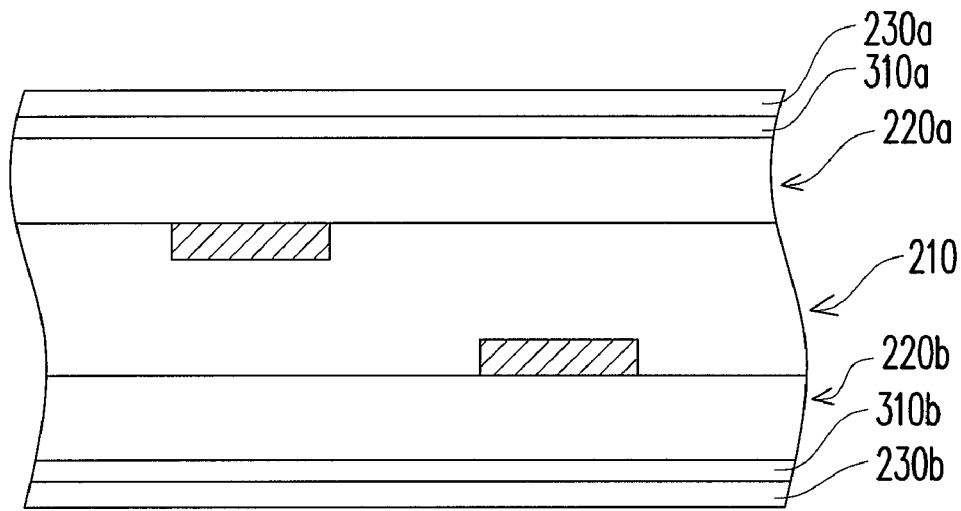

Further, referring to FIG. 3A, in this embodiment, a first initial conductive layer 310a and a second initial conductive layer 310b may be respectively formed on the first dielectric layer 220a and the second dielectric layer 220b before forming the first plating-resistant layer 230a and the second plating-resistant layer 230b. A method for forming the first initial conductive layer 310a and the second initial conductive layer 310b comprises chemical metal deposition, which may be chemical copper deposition. The first dielectric layer 220a and the second dielectric layer 220b may respectively comprise a plurality of first catalyst particles (not shown) and a plurality of second catalyst particles (not shown).

The first catalyst particles and the second catalyst particles may respectively comprise a plurality of nanoparticles (not shown). The nanoparticles may be formed by transition metal complex, wherein a material of the transition metal complex is selected from manganese, chromium, palladium, platinum, or a combination thereof. In addition, the first catalyst particles and the second catalyst particles may further comprise a plurality of polymer films (not shown) respectively covering the nanoparticles. A material of the polymer films may be polyimide or other suitable polymer materials.

Figure 3B:
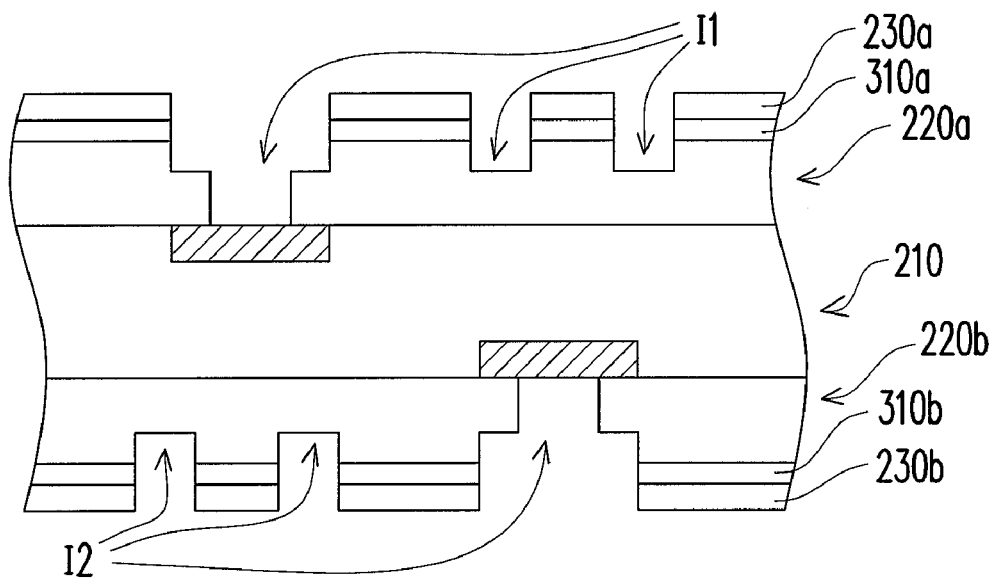

Thereafter, referring to FIG. 3B, the first plating-resistant layer 230a, the first initial conductive layer 310a, and the first dielectric layer 220a are patterned, so as to form a first recess pattern I1 on the first dielectric layer 220a, and to activate and expose a portion of the first catalyst particles in the first recess pattern I1. Furthermore, the second plating-resistant layer 230b, the second initial conductive layer 310b, and the second dielectric layer 220b are patterned, so as to form a second recess pattern I2 on the second dielectric layer 220b, and to activate and expose a portion of the second catalyst particles in the second recess pattern I2.

Figure 3C:
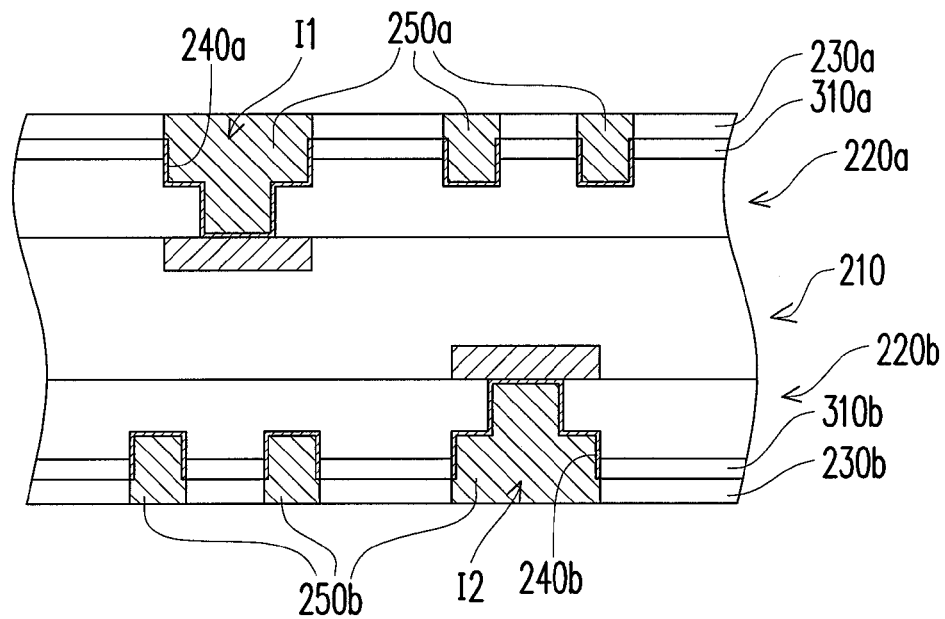

Next, referring to FIG. 3C, a first conductive base layer 240a and a second conductive base layer 240b are respectively formed in the first recess pattern I1 and the second recess pattern I2 by a chemical method. In this embodiment, the chemical method comprises electroless plating or chemical vapor deposition.

It is noted that, when the first conductive base layer 240a is formed by the chemical method, the first conductive base layer 240a is formed only on a surface of the first dielectric layer 220a having the activated first catalyst particles (i.e. inside the first recess pattern I1) and on an opening edge of the first initial conductive layer 310a. Hence, in this embodiment, the first conductive base layer 240a may be selectively formed on a certain area of the first dielectric layer 220a (for example, the first recess pattern I1) and an opening edge of the first initial conductive layer 310a. Similarly, in this embodiment, the second conductive base layer 240b may be selectively formed on a certain area of the second dielectric layer 220b (for example, the second recess pattern I2) and an opening edge of the second initial conductive layer 310b.

Following that, referring to FIG. 3C, a first thick conductive layer 250a and a second thick conductive layer 250b are respectively formed on the first conductive base layer 240a and the second conductive base layer 240b by electroplating. It is noted that the first conductive base layer 240a and the first initial conductive layer 310a are electrically connected, and the second conductive base layer 240b and the second initial conductive layer 310b are electrically connected in this embodiment. Therefore, the first thick conductive layer 250a and the second thick conductive layer 250b can be formed by electroplating. Compared with a conventional technique which applies electroless plating in forming conductive layers, this embodiment which adopts electroplating can greatly reduce the time required for forming the conductive layers.

Figure 3D:
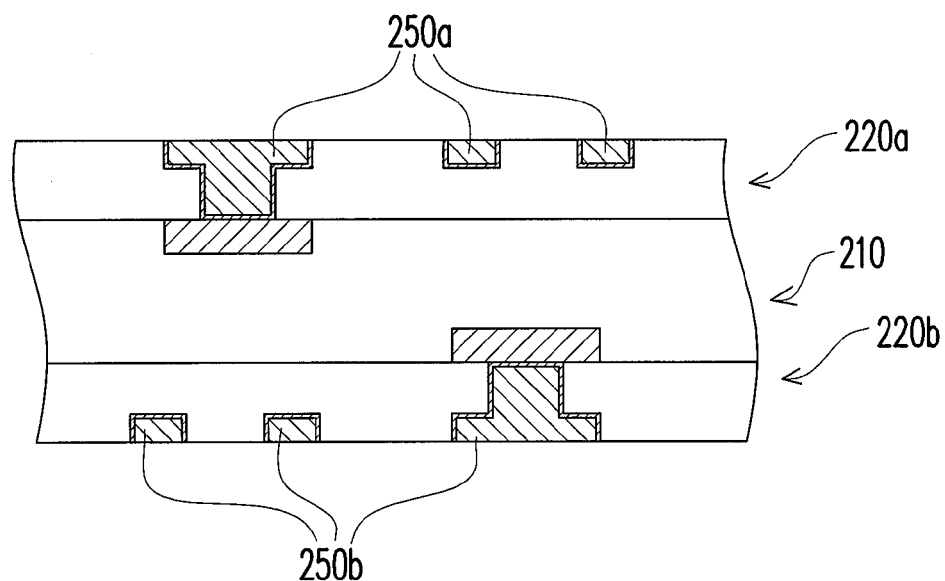

Then, referring to FIG. 3D, the first plating-resistant layer 230a and the second plating-resistant layer 230b are removed. Next, the first initial conductive layer 310a and a portion of the first thick conductive layer 250a protruding outside the first dielectric layer 220a are removed, and the second initial conductive layer 310b and a portion of the second thick conductive layer 250b protruding outside the second dielectric layer 220b are removed. A method for removing the first initial conductive layer 310a, the portion of the first thick conductive layer 250a, the second initial conductive layer 310b, and the portion of the second thick conductive layer 250b comprises etching or polishing, wherein the etching process is, for example, performed by using an alkaline etching solution, which comprises formaldehyde and ammonia.

Figure 1B:
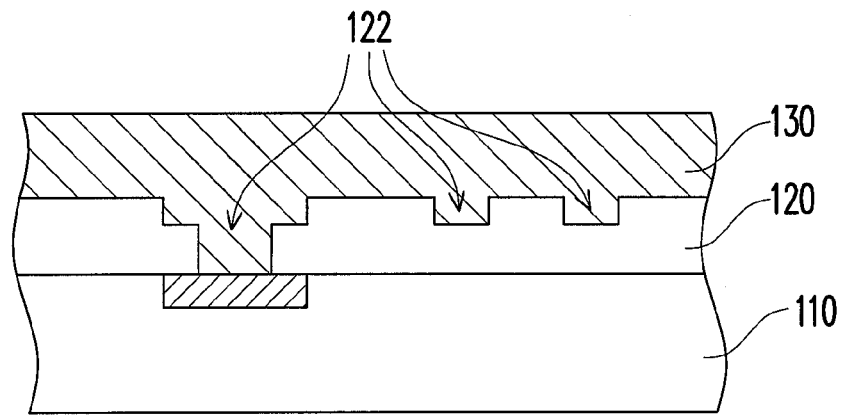
Figure 1C:
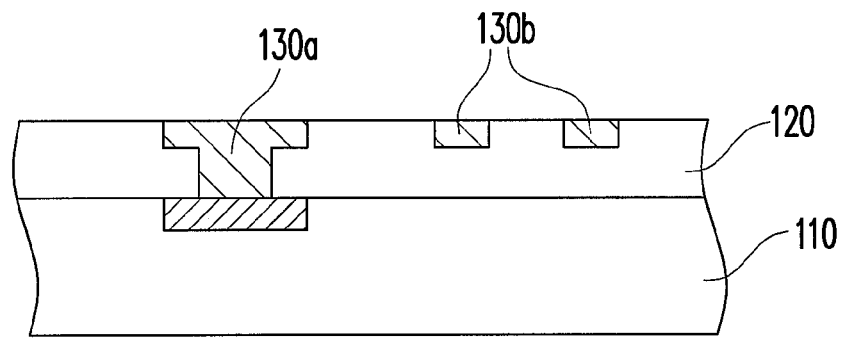

It is noted that, a thickness (about 0.8~1.2 micrometers) of the first initial conductive layer 310a, the portion of the first thick conductive layer 250a, the second initial conductive layer 310b, and the portion of the second thick conductive layer 250b to be removed in this embodiment is far smaller than a thickness (about 20 micrometers) of the copper layer 130 to be removed in the conventional technique (referring to FIGS. 1B and 1C). Hence, unlike the conventional technique which usually damages the circuit 130b or the conductive via 130a, this embodiment can increase removing speed and prevent such a problem from happening.

Second Embodiment

FIGS. 4A through 4E are schematic cross-sectional views illustrating a fabricating process of a structure with an embedded circuit according to the second embodiment of the present invention.

Figure 4A:
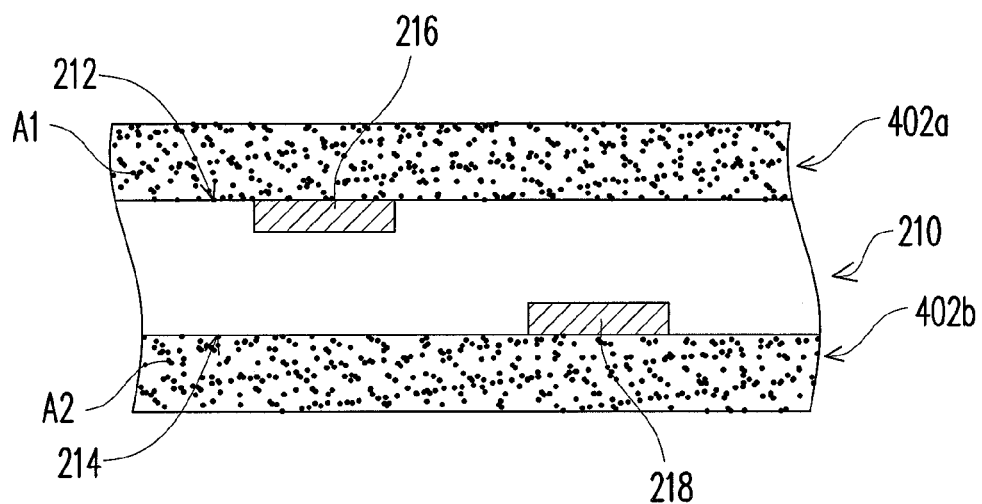
FIGS. 4A through 4E are schematic cross-sectional views illustrating a fabricating process of a structure with an embedded circuit according to the second embodiment of the present invention.

First, referring to FIG. 4A, a substrate 210 is provided, and a first dielectric layer 402a and a second dielectric layer 402b are respectively formed on an upper surface 212 and a lower surface 214 of the substrate 210. The first dielectric layer 402a and the second dielectric layer 402b respectively comprise a plurality of first catalyst particles A1 and a plurality of second catalyst particles A2. The first catalyst particles A1 and the second catalyst particles A2 are the same as the first and the second catalyst particles in the first embodiment.

Figure 4B:
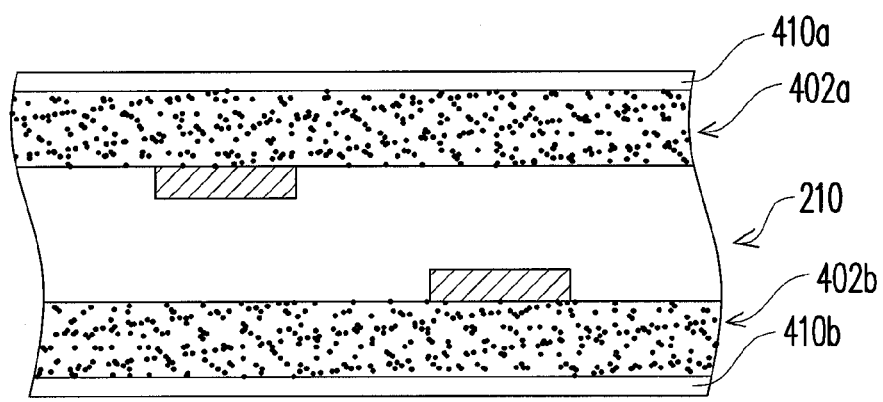

Then, referring to FIG. 4B, a first hydrophilic film 410a and a second hydrophilic film 410b are respectively formed on the first dielectric layer 402a and the second dielectric layer 402b. A method for forming the first hydrophilic film 410a and the second hydrophilic film 410b is, for example, coating. A material of the first hydrophilic film 410a and the second hydrophilic film 410b comprises a hydrophilic polymer material, which comprises carbon and hydrogen. The hydrophilic polymer material comprises polyvinyl alcohol, polyoxyethylene, or poly(acrylic acid) bonded with a hydrophilic functional group, wherein the hydrophilic functional group is OH, $CONH_2$, $SO_3$, COOH, or other suitable hydrophilic functional groups.

Figure 4C:
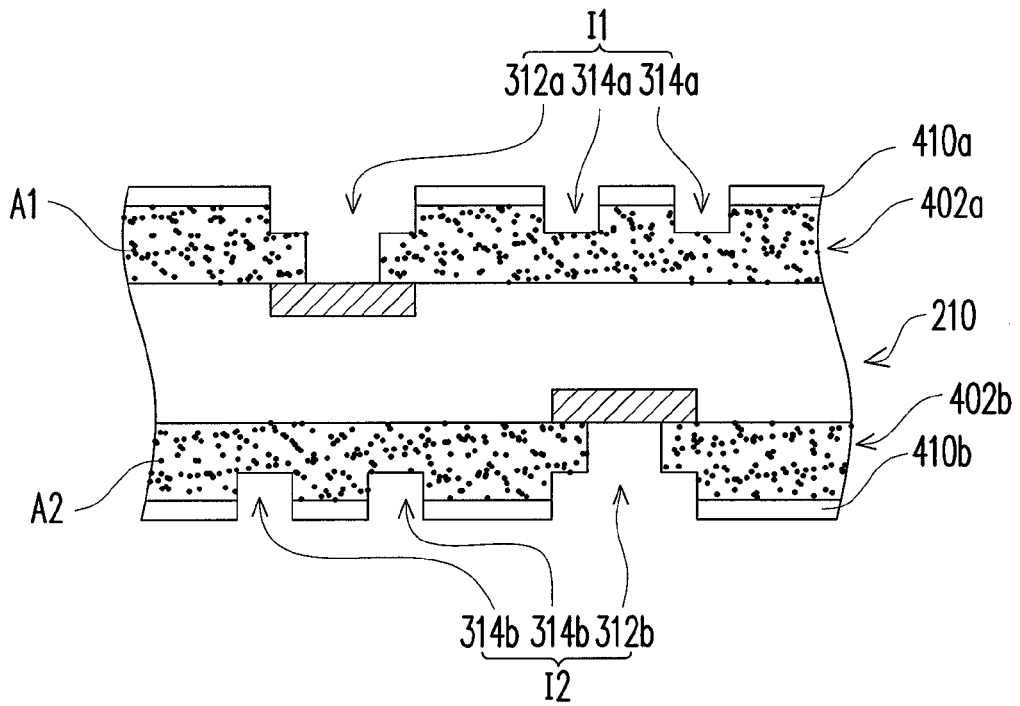

Thereafter, referring to FIG. 4C, the first hydrophilic film 410a and the first dielectric layer 402a are patterned, so as to form a first recess pattern I1 on the first dielectric layer 402a, and to activate and expose a portion of the first catalyst particles A1 in the first recess pattern I1. The first recess pattern I1 comprises at least a first through hole 312a and at least a first trench 314a. A method for forming the first recess pattern I1 may be simultaneously or sequentially forming the first through hole 312a and the first trench 314a. The second hydrophilic film 410b and the second dielectric layer 402b are patterned, so as to form a second recess pattern I2 on the second dielectric layer 402b, and to activate and expose a portion of the second catalyst particles A2 in the second recess pattern I2. The second recess pattern I2 comprises at least a second through hole 312b and at least a second trench 314b. A method for forming the second recess pattern I2 may be simultaneously or sequentially forming the second through hole 312b and the second trench 314b.

In this embodiment, a method for patterning the first hydrophilic film 410a, the first dielectric layer 402a, the second hydrophilic film 410b and the second dielectric layer 402b comprises laser ablating, plasma etching, or mechanical cutting, wherein the mechanical cutting process comprises water-jet cutting, sandblasting, or routing. In addition, smear, which adheres to the first dielectric layer 402a and the second dielectric layer 402b, easily occurs during the aforesaid patterning process. Hence, a desmear treatment may be performed on the first recess pattern I1 and the second recess pattern I2 to remove the smear after the patterning process. The desmear treatment comprises a chemical oxidation reduction or a plasma treatment.

Figure 4D:
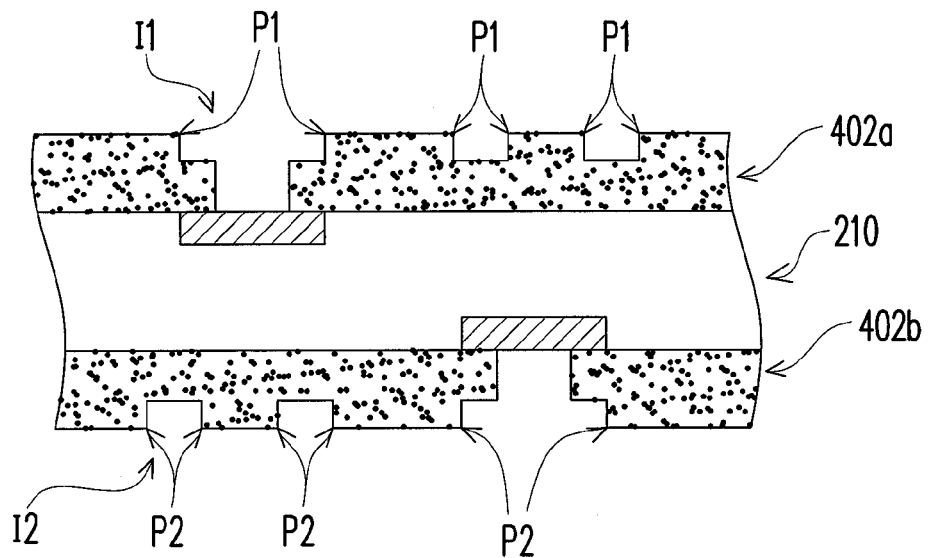

Next, referring to FIG. 4D, the first hydrophilic film 410a and the second hydrophilic film 410b are removed. A method for removing the first hydrophilic film 410a and the second hydrophilic film 410b comprises water washing, and a solution used in the water washing process comprises water. It is known from the above that the removal of the first hydrophilic film 410a and the second hydrophilic film 410b helps to remove the aforesaid smear and enhance the reliability of the conductive layers to be formed on the first dielectric layer 402a and the second dielectric layer 402b. It is noted that a fluorescent agent which reacts to ultraviolet light may be added into the first and the second hydrophilic films 410a and 410b. After removing the first and the second hydrophilic films 410a and 410b, the fluorescent agent can be used to observe whether the first and the second hydrophilic films 410a and 410b are completely removed, and further to judge whether the aforesaid smear is cleaned.

In addition, the conductive layers to be formed may easily extend outside the first recess pattern I1 and the second recess pattern I2 through an upper edge P1 of a sidewall of the first recess pattern I1 and an upper edge P2 of a sidewall of the second recess pattern I2, and affect the reliability of the conductive layers. Hence, in this embodiment, after the first hydrophilic film 410a is removed, the upper edge P1 of the sidewall of the first recess pattern I1 on the first dielectric layer 402a and the upper edge P2 of the sidewall of the second recess pattern I2 on the second dielectric layer 402b are passivated to prevent the conductive layers formed in the first and the second recess patterns I1 and I2 from extending outside the first and the second recess patterns I1 and I2 through the upper edges P1 and P2. A method for passivating the first and the second dielectric layers 310a and 310b comprises performing an alkaline treatment on the first and the second dielectric layers 310a and 310b.

Figure 4E:
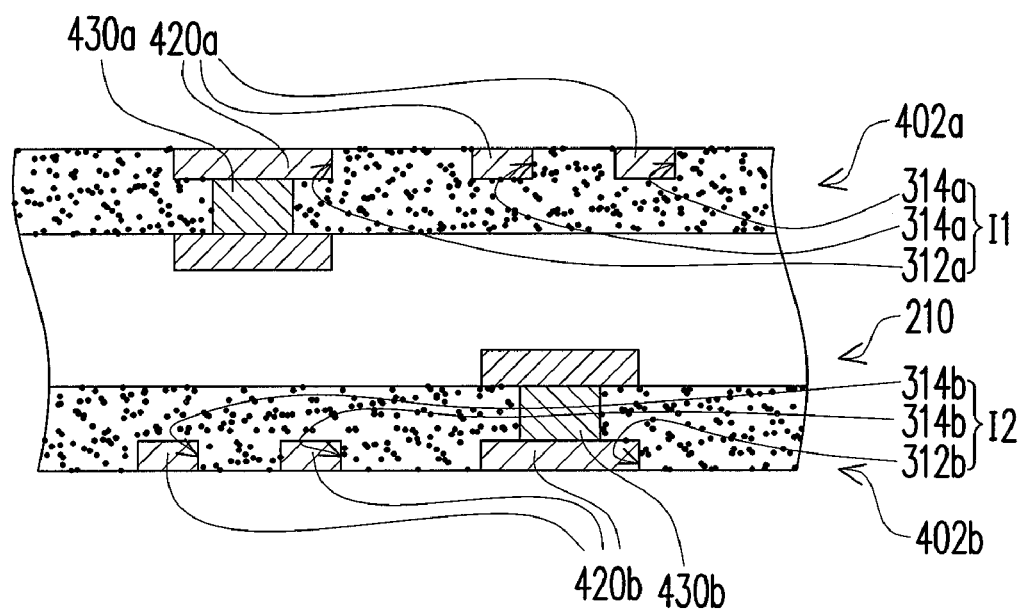

Next, referring to FIG. 4E, a first patterned conductive layer 420a and a second patterned conductive layer 420b are respectively formed in the first recess pattern I1 and the second recess pattern I2 by using a chemical method, which comprises electroless plating or chemical vapor deposition. The electroless plating process is, for example, electroless plating of copper. In this embodiment, before forming the first patterned conductive layer 420a and the second patterned conductive layer 420b, a first conductive material 430a may be disposed in the first through hole 312a of the first recess pattern I1 and a second conductive material 430b may be disposed in the second through hole 312b of the second recess pattern I2. The first and the second conductive materials 430a and 430b comprise copper paste, copper glue, carbon glue, carbon paste, silver paste, or silver glue.

To conclude, the dielectric layer in the first embodiment of the present invention is covered by the plating-resistant layer. Consequently, the conductive base layer may be selectively formed on a certain area of the dielectric layer by using the chemical method. It is known from the above that, this embodiment is different from the conventional technique and does not require an etching process for removing additional conductive layers. Therefore, this embodiment is adapted for the fabrication of a fine circuit. Moreover, unlike the conventional technique in which a seed layer needs to be formed on the dielectric layer before performing an electroless plating process, the chemical method in this embodiment can be applied in directly forming the conductive base layer on the dielectric layer. Hence, the fabricating process in this embodiment is simplified.

Further, in the first embodiment of the present invention, the conductive base layer and the initial conductive layer are electrically connected with each other. Consequently, the conductive layers can be formed by electroplating to reduce the time required. A thickness of the conductive layers (the initial conductive layer and a portion of the thick conductive layer) to be removed in this embodiment is much smaller than that in the conventional technique. Hence, the removing speed is faster and the removing process can be easily controlled in this embodiment.

In addition to the above, a fabricating process of a structure with an embedded circuit in the second embodiment of the present invention is to form a hydrophilic film on the dielectric layer, pattern the hydrophilic film and the dielectric layer, and then remove the hydrophilic film to clean out the smear which occurs when the dielectric layer is patterned. Thereby, the reliability of the conductive layers to be formed on the dielectric layer can be enhanced.

Moreover, in the second embodiment of the present invention, a portion of the catalyst particles in the dielectric layer is activated and exposed in the recess pattern when the recess pattern is formed on the dielectric layer. Hence, unlike the conventional technique in which a seed layer needs to be formed before performing an electroless plating process, the chemical method (for example, electroless plating) in this embodiment can be applied in directly forming the conductive base layer in the recess pattern. Because the conductive base layer is only formed on a portion of the dielectric layer, which has the activated catalyst particles, the conductive base layer can be selectively formed on a certain area of the dielectric layer by the chemical method in this embodiment.

Although the present invention has been disclosed by the above embodiments, they are not intended to limit the present invention. Persons of ordinary knowledge in the art may make some modifications and alterations without departing from the scope and spirit of the present invention. Therefore, the protection range sought by the present invention falls within the appended claims.

What is claimed is:

1. A fabricating process of a structure with an embedded circuit, comprising:
   providing a substrate having an upper surface and a lower surface opposite to the upper surface;
   forming a first dielectric layer on the upper surface of the substrate;
   forming a first plating-resistant layer on the first dielectric layer;
   patterning the first plating-resistant layer and the first dielectric layer, so as to form a first recess pattern on the first dielectric layer;
   forming a first conductive base layer in the first recess pattern by using a chemical method, and the first conductive base layer exposing the first plating-resistant layer; and
   removing the first plating-resistant layer from the remaining first dielectric layer,
   wherein a material of the first plating-resistant layer comprises a hydrophobic polymer material.

2. The fabricating process as claimed in claim 1, wherein the hydrophobic polymer material comprises carbon and hydrogen.

3. The fabricating process as claimed in claim 2, wherein the hydrophobic polymer material comprises methacrylate resin, vinyl phenyl resin, allyl resin, polyacrylate resin, polyether resin, polyolefin resin, polyamine resin, or polysiloxane resin.

4. The fabricating process as claimed in claim 2, wherein a method for forming the first plating-resistant layer comprises liquid phase deposition (LPD) or molecular vapor deposition (MVD).

5. The fabricating process as claimed in claim 2, wherein a method for removing the first plating-resistant layer comprises dry etching, a reverse process of molecular vapor deposition, polishing, or scraping.

6. The fabricating process as claimed in claim 1, wherein a method for patterning the first plating-resistant layer and the first dielectric layer comprises laser ablating, plasma etching, or mechanical cutting.

7. The fabricating process as claimed in claim 1, wherein the chemical method comprises chemical metal deposition or chemical vapor deposition.

8. The fabricating process as claimed in claim 1, further comprising forming a first thick conductive layer on the first conductive base layer by electroless plating after forming the first conductive base layer, and a thickness of the first thick conductive layer being larger than that of the first conductive base layer.

9. The fabricating process as claimed in claim 1, further comprising:
   forming a second dielectric layer on the lower surface of the substrate;
   forming a second plating-resistant layer on the second dielectric layer;
   patterning the second plating-resistant layer and the second dielectric layer, so as to form a second recess pattern on the second dielectric layer;
   forming a second conductive base layer in the second recess pattern by using the chemical method, and the second conductive base layer exposing the second plating-resistant layer; and
   removing the second plating-resistant layer.

10. The fabricating process as claimed in claim 9, further comprising forming a second thick conductive layer on the second conductive base layer by electroless plating after forming the second conductive base layer, and a thickness of the second thick conductive layer being larger than that of the second conductive base layer.

11. The fabricating process as claimed in claim 1, further comprising forming a first initial conductive layer on the first dielectric layer before forming the first plating-resistant layer.

12. The fabricating process as claimed in claim 11, wherein the first dielectric layer comprises a plurality of catalyst particles, and when the first recess pattern is formed on the first dielectric layer, the fabricating process further comprises activating and exposing a portion of the catalyst particles, and the chemical method comprises electroless plating.

13. The fabricating process as claimed in claim 12, wherein a material of the catalyst particles comprise transition metal complex.

14. The fabricating process as claimed in claim 13, wherein a material of the transition metal complex is selected from a group of manganese, chromium, palladium, and platinum.

15. The fabricating process as claimed in claim 11, further comprising forming a first thick conductive layer on the first conductive base layer by electroplating after forming the first conductive base layer.

16. The fabricating process as claimed in claim 15, further comprising removing the first initial conductive layer and a portion of the first thick conductive layer protruding outside the first dielectric layer after removing the first plating-resistant layer.

17. The fabricating process as claimed in claim 16, further comprising:
   forming a second dielectric layer on the lower surface of the substrate;
   forming a second initial conductive layer on the second dielectric layer;
   forming a second plating-resistant layer on the second dielectric layer;

patterning the second plating-resistant layer and the second dielectric layer, so as to form a second recess pattern on the second dielectric layer;

forming a second conductive base layer in the second recess pattern by the chemical method;

forming a second thick conductive layer on the second conductive base layer by electroplating;

removing the second plating-resistant layer; and removing the second initial conductive layer and a portion of the second thick conductive layer protruding outside the second dielectric layer.

18. A fabricating process of a structure with an embedded circuit, comprising:

providing a substrate having an upper surface and a lower surface opposite to the upper surface;

forming a first dielectric layer having a plurality of first catalyst particles on the upper surface of the substrate;

forming a first hydrophilic film on the first dielectric layer;

patterning the first hydrophilic film and the first dielectric layer, so as to form a first recess pattern on the first dielectric layer, and to activate and expose a portion of the first catalyst particles in the first recess pattern;

removing the first hydrophilic film; and forming a first patterned conductive layer in the first recess pattern by using a chemical method.

19. The fabricating process as claimed in claim 18, wherein the first hydrophilic film comprises a hydrophilic polymer material comprising carbon and hydrogen.

20. The fabricating process as claimed in claim 19, wherein the hydrophilic polymer material comprises polyvinyl alcohol, polyoxyethylene, or poly(acrylic acid) bonded with a hydrophilic functional group, wherein the hydrophilic functional group is OH, $CONH_2$, $SO_3$, or COOH.

21. The fabricating process as claimed in claim 18, wherein a method for forming the first hydrophilic film comprises liquid phase deposition (LPD) or molecular vapor deposition (MVD).

22. The fabricating process as claimed in claim 18, wherein a method for removing the first hydrophilic film comprises water washing.

23. The fabricating process as claimed in claim 18, wherein a material of the first catalyst particles comprise transition metal complex.

24. The fabricating process as claimed in claim 23, wherein a material of the transition metal complex is selected from a group of manganese, chromium, palladium, and platinum.

25. The fabricating process as claimed in claim 18, wherein a method for patterning the first hydrophilic film and the first dielectric layer comprises laser ablating, plasma etching, or mechanical cutting.

26. The fabricating process as claimed in claim 18, wherein the chemical method comprises electroless plating or chemical vapor deposition.

27. The fabricating process as claimed in claim 18, further comprising performing a desmear treatment on the first recess pattern after patterning the first hydrophilic film and the first dielectric layer.

28. The fabricating process as claimed in claim 18, further comprising disposing a first conductive material in the first recess pattern before forming the first patterned conductive layer.

29. The fabricating process as claimed in claim 18, further comprising:

forming a second dielectric layer having a plurality of second catalyst particles on the lower surface of the substrate;

forming a second hydrophilic film on the second dielectric layer;

patterning the second hydrophilic film and the second dielectric layer, so as to form a second recess pattern on the second dielectric layer, and to activate and expose a portion of the second catalyst particles in the second recess pattern;

removing the second hydrophilic film; and forming a second patterned conductive layer in the second recess pattern by using the chemical method.

30. The fabricating process as claimed in claim 29, further comprising disposing a second conductive material in the second recess pattern before forming the second patterned conductive layer.

* * * * *